(12) United States Patent
Bielak (10) Patent No.: US 10,150,319 B1
(45) Date of Patent: Dec. 11, 2018

(54) MITIGATING TRAILING EDGE VOIDS IN FLEXOGRAPHIC PRINTING

(71) Applicant: Eastman Kodak Company, Rochester, NY (US)

(72) Inventor: Richard Roman Bielak, Port Coquitlam (CA)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 15/616,134

(22) Filed: Jun. 7, 2017

(51) Int. Cl.
  *G06K 15/02* (2006.01)
  *B41N 1/12* (2006.01)
  *G03F 7/11* (2006.01)

(52) U.S. Cl.
  CPC . *B41N 1/12* (2013.01); *G03F 7/11* (2013.01)

(58) Field of Classification Search
  CPC combination set(s) only.
  See application file for complete search history.

(56) References Cited

U.S. PATENT DOCUMENTS

| 9,235,126 B1 | 1/2016 | Bielak et al. |
| 9,375,910 B2 * | 6/2016 | Bielak ................ G03F 7/2022 |
| 2010/0224091 A1 | 9/2010 | Zwadlo |
| 2016/0221379 A1 | 8/2016 | Namba et al. |

* cited by examiner

*Primary Examiner* — Barbara Reinier
(74) *Attorney, Agent, or Firm* — Kevin E. Spaulding (57) ABSTRACT

A method for forming a flexographic plate for an image pattern including image features. The image pattern includes an array of image pixels, wherein the image pixels include printing pixels corresponding to portions of the image pattern where ink is to be printed on a substrate by the flexographic plate.

Edge regions and interior regions of the image features are identified, which are separated by gap regions. A fine texture pattern is applied to the edge regions and a coarse texture pattern is applied to the interior regions to form a textured image pattern which is used to form the flexographic plate. No texture pattern is applied to the gap regions thereby leaving gaps between the edge regions and the interior regions of the image features.

15 Claims, 14 Drawing Sheets

MITIGATING TRAILING EDGE VOIDS IN FLEXOGRAPHIC PRINTING

FIELD OF THE INVENTION

The present invention relates to a method forming an image on a flexographic plate.

BACKGROUND OF THE INVENTION

In graphic arts technology, a number of well-established printing processes utilize image carriers with a three-dimensional (3D) representation of data, the most popular of them being flexographic printing, which uses flexible relief plates or sleeves. A relief plate includes raised relief features, which are raised above the plate floor. It is the raised features that accept and transfer ink to the substrate. In a traditional flexographic prepress process with chemical etching, there is no possibility of fine control of relief properties other than the relief depth.

Figure 1:
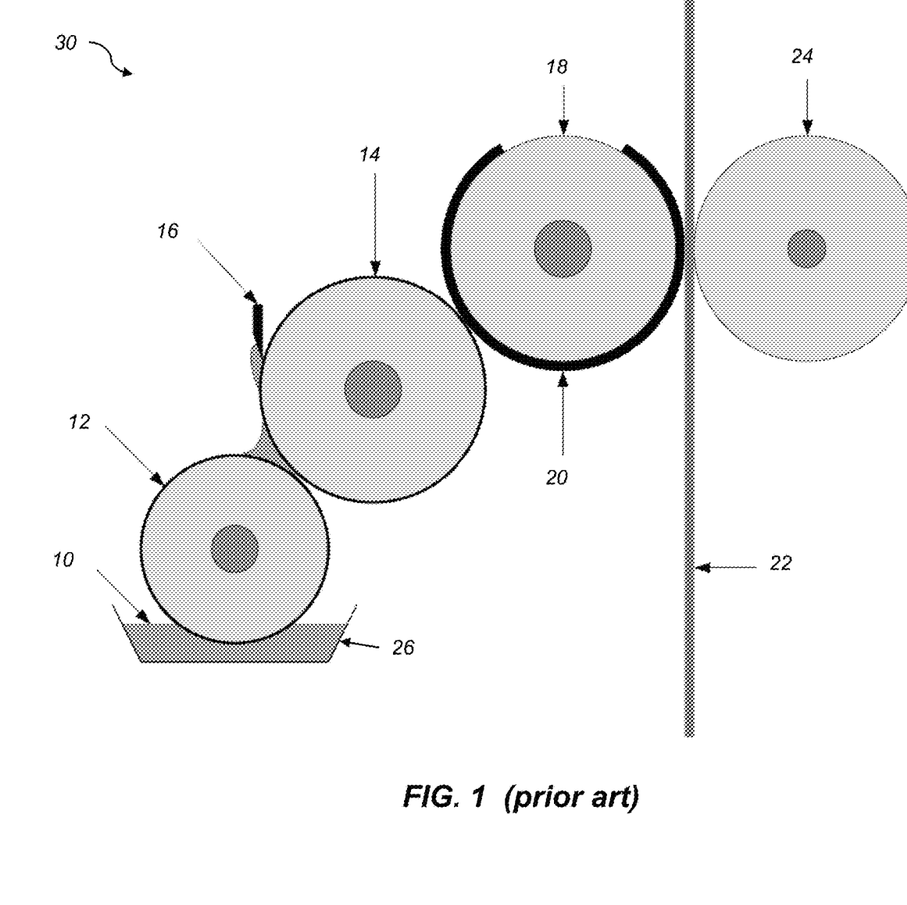
FIG. 1 shows simplified diagram of a flexographic printing press.

Flexographic printing uses a flexible relief plate 20 to print on a wide variety of substrates including paper, cardboard, plastic, and metal films. A simplified diagram of a flexographic printing press 30 is shown in FIG. 1. Ink 10 in a fountain pan 26 is taken up by a rubber fountain roller 12 and transferred to the surface of the anilox roller 14. The surface of the anilox roller 14 is composed of an array of indented cells that allow careful metering of the ink volume. A doctor blade 16 removes any excess ink 10 from the anilox roller 14 before the ink 10 is transferred to the printing plate cylinder 18. Mounted on the plate cylinder 18 is a flexographic printing plate 20, which can also be referred to as a flexible relief plate. The final step transfers the ink 10 from the plate 20 to substrate 22, with impression cylinder 24 supplying support for the substrate 22.

The process used to produce an image on a flexible relief plate 20 typically includes the following steps:
1. Expose the back of the plate to UV light;
2. Expose an intermediate film to the desired image;
3. Laminate the film to the top of the plate;
4. Expose the plate through the film using UV light;
5. Remove the film;
6. Use a solvent to wash away the unexposed plate material;
7. Apply additional exposure to harden the plate;
8. Dry the plate to remove as much of the solvent as possible.

The back exposure in step 1 is used to establish the floor 220 of the plate 20. The intensity of the exposure decreases as the illumination penetrates the plate because of absorption in the plate material. Once the intensity drops below a threshold value, there is insufficient cross linking in the polymer comprising the plate, and the remaining underexposed polymer can be washed away. This is typically the top 0.5 mm of the plate. To form the relief, the front of the plate is exposed through an image layer with enough intensity so that sufficient cross-linking occurs all the way down to the plate floor 220.

Figure 2:
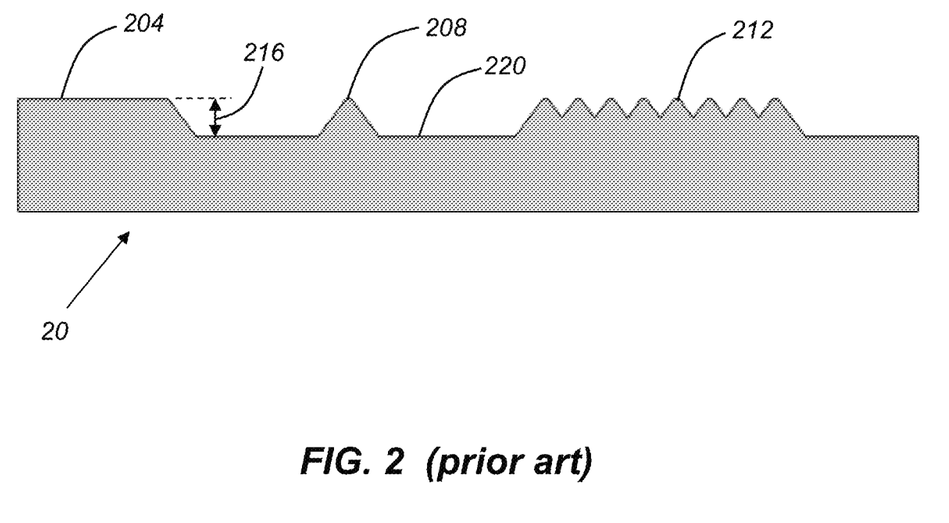
FIG. 2 illustrates a cross section through an exemplary flexographic printing plate.

For every opening in the image layer, a cone of UV light (typically with an angle of about 40 degrees from a normal to the plane) propagates through the plate 20 forming cone-shaped relief dots. A cross section of an exemplary plate 20 is shown in FIG. 2. The following features are depicted in the cross section: a solid area raised feature 204; an isolated dot raise feature 208; and a raised feature 212 including an array of closely spaced dots created by a halftone screen. The height of the plate relief above the plate floor 220 is shown by relief depth 216.

Figure 3:
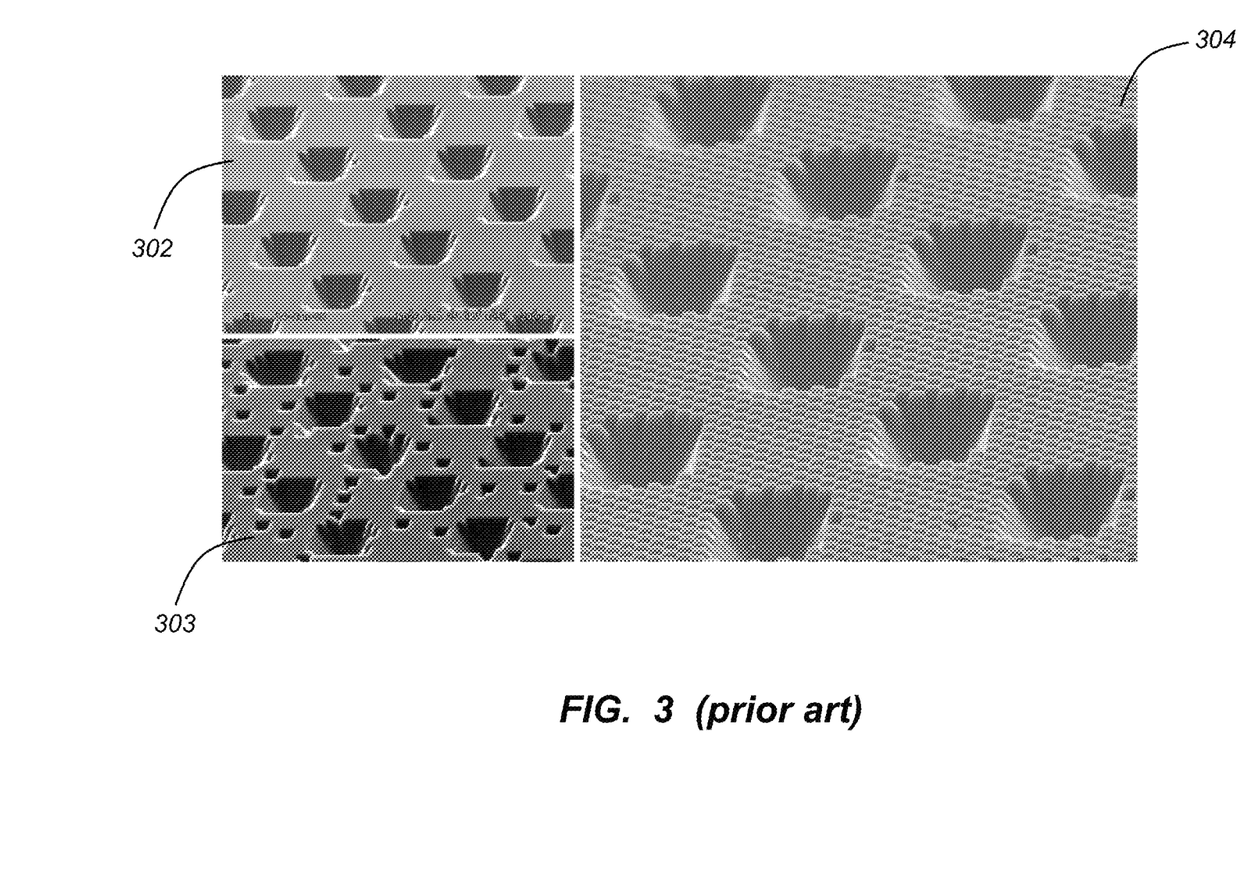
FIG. 3 shows textures applied to the raised features of a flexographic printing plate.

Ink uniformity and density can be improved if a surface pattern or surface texture is applied to the flat tops of the relief pattern as shown in the FIG. 3, which compares a no surface texture pattern 302, a conventional plate cell pattern 303 and a checkerboard surface texture 304. The checkerboard surface texture 304 in this example is provided by a Kodak DigiCap NX Screening process which forms a stretched checkerboard pattern 304 composed of 5×10 micron rectangles. This texture pattern has been found to work well for process inks printed on a paper substrate.

Such a fine texture pattern has an additional advantage in that it allows the edges of printing features to be well defined. The pattern does have its limits. When printing on plastic substrates, voids can appear in large features due to air entrapment. The pattern can also perform poorly if large volumes of ink need to be transferred to the substrate 22. To eliminate these problems, a coarser pattern is required. However, a coarser pattern will compromise edge definition.

In flexographic printing, large solid areas of a relief pattern can suffer from a number of artifacts. The ink can deposit unevenly, resulting in a reduction in ink density, and in the solid area having a mottled appearance. Ink can be squeezed off the relief feature near edges resulting in low ink density just inside the edge and high density just outside the edge. Air bubbles trapped between the plate 20 and substrate 22 can cause voids to appear at the trailing edge of large features.

Prior art exists to mitigate some these problems. For the case of voids due to air bubbles, U.S. Patent Application Publication 2010/0224091 to G. Zwadlo, entitled "Trailing edge pattern for relief plate feature," describes a method that reduces voids by forming sunken patterns in the trailing edge of large print features.

U.S. Patent Application Publication 2016/0221379 to Y. Namba et al., entitled "Flexo printing plate," attempts to deal with the voids by introducing small depressions in the large solid relief regions by having the density of the small depressions decrease with distance from the edge of the relief.

Figure 4:
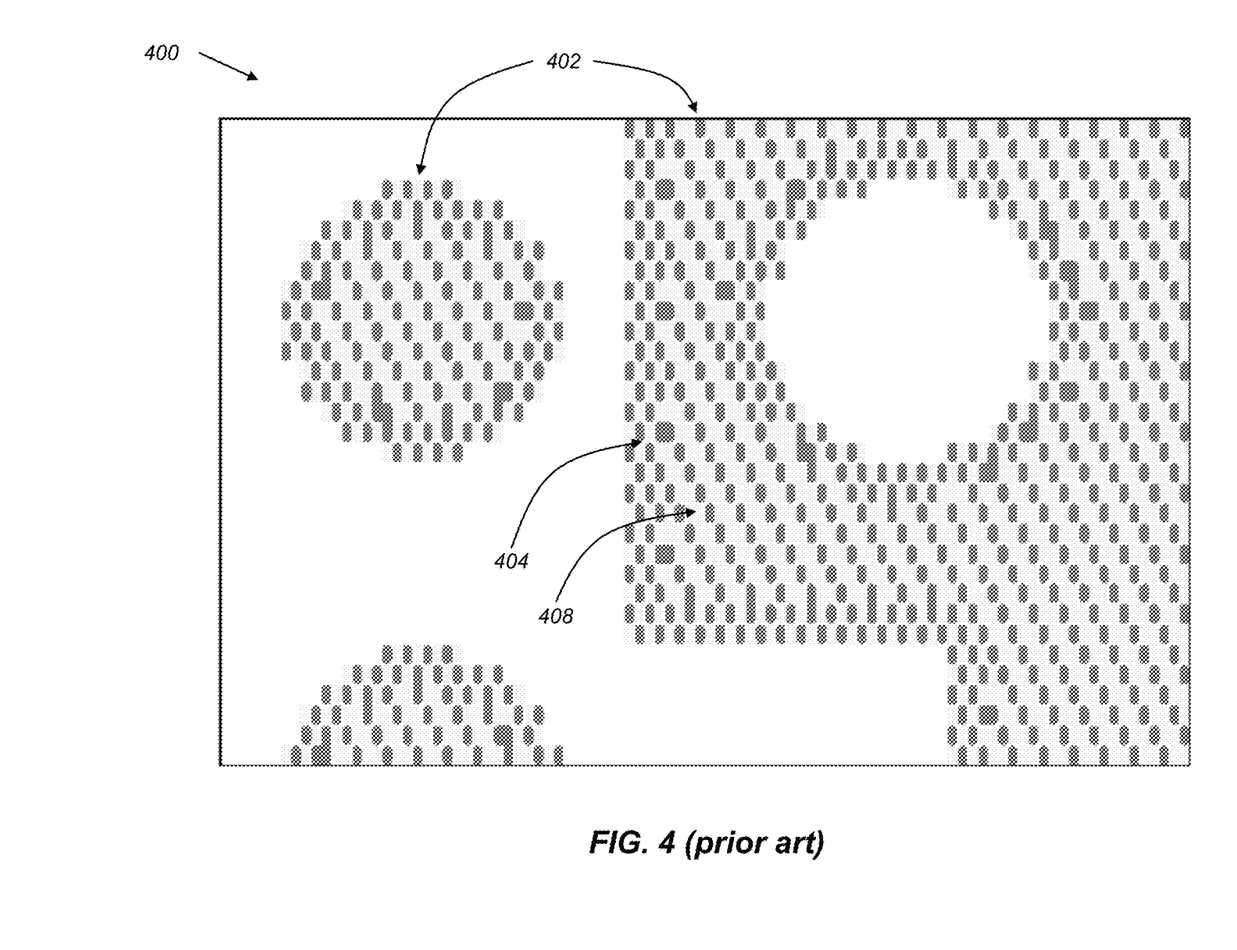
FIG. 4 shows a textured image pattern where a fine texture pattern is applied to the edges of the image features and a coarse texture pattern is applied to the interior of the image features.
Figure 5:
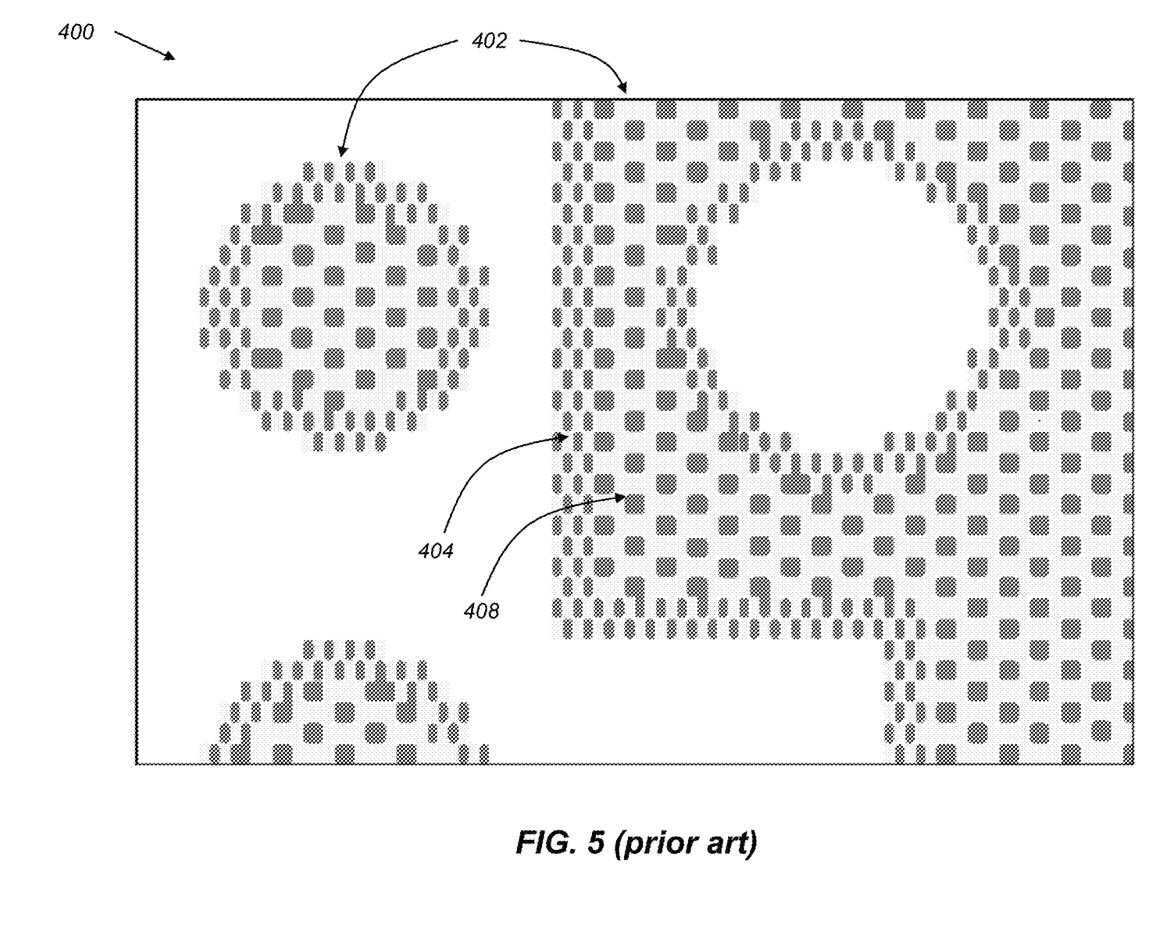
FIG. 5 shows a textured image pattern similar to FIG. 4 except that a coarser pattern is applied to the interior of the image features.

A preferred method combines a fine texture pattern at the edge of printing features with a coarser pattern in the interior of features as described in commonly-assigned U.S. Pat. No. 9,235,126 to R. Bielak et al., entitled "Flexographic surface patterns," which is incorporated herein by reference This approach is illustrated in the textured image patterns 400 of FIGS. 4 and 5. In FIG. 4, a fine texture pattern 404 is applied near the edges of the relief features 402 and a coarse texture pattern 408 is applied to the interior of the relief features 402. FIG. 5 is similar to FIG. 4 except that the coarse texture pattern 408 is coarser than that of FIG. 4. A weakness of this method is that the interior pattern cannot be simultaneously optimized for both uniform ink deposition and resistance to voids at the trailing edge of large relief features 402.

There remains a need for a method for introducing texture patterns to relief features in a flexographic printing plate which is simultaneously optimized for both uniform ink deposition and resistance to voids at the trailing edge of large relief features.

SUMMARY OF THE INVENTION

The present invention represents a method for forming a flexographic plate including:
providing an image pattern including image features to be formed on the flexographic plate, the image pattern including an array of image pixels, wherein the image pixels include printing pixels corresponding to portions of the image pattern where ink is to be printed on a substrate by the flexographic plate;

identifying edge regions of the image features;
identifying interior regions of the image features;
wherein the edge regions and the interior regions are separated by gap regions;
providing a fine texture pattern;
providing a coarse texture pattern;
applying the fine texture pattern to the edge regions of the image features and applying the coarse texture pattern to the interior regions of the image features to form a textured image pattern, wherein no texture pattern is applied to the gap regions thereby leaving gaps between the edge regions and the interior regions of the image features; and
forming a flexographic plate using the textured image pattern.

This invention has the advantage that voids along the trailing edge of relief features are substantially eliminated by introducing a gap region between an edge region with a fine texture pattern and an interior region with a coarser texture pattern.

It has the additional advantage that the textured image pattern is simultaneously optimized for both uniform ink deposition and resistance to voids at the trailing edge of large relief features.

BRIEF DESCRIPTION OF THE DRAWINGS

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense.

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

While the present invention is described in connection with one of the embodiments, it will be understood that it is not intended to limit the invention to this embodiment. On the contrary, it is intended to cover alternatives, modifications, and equivalents.

Figure 6:
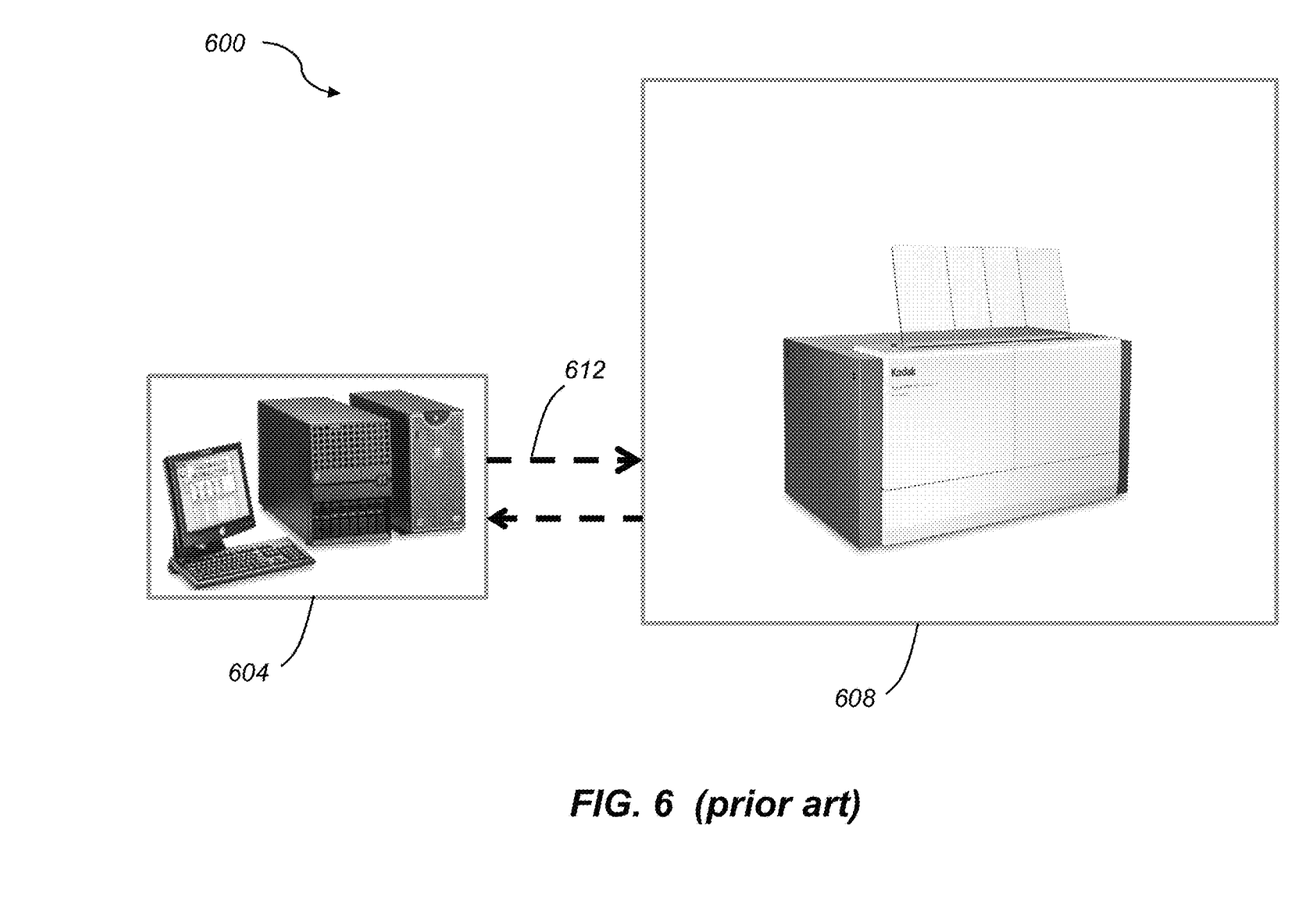
FIG. 6 shows a block diagram of an exemplary plate forming system including a digital front end driving an imaging device.

FIG. 6 shows an exemplary plate forming system 600 for forming flexographic printing plates. The plate forming system 600 includes an imaging device 608 which is driven by a digital front end (DFE) 604. The DFE 604 receives printing jobs in a digital form from desktop publishing (DTP) systems (not shown), and renders the digital information for imaging. The rendered information and imaging device control data are communicated between DFE 604 and imaging device 608 over interface line 612.

Figure 7:
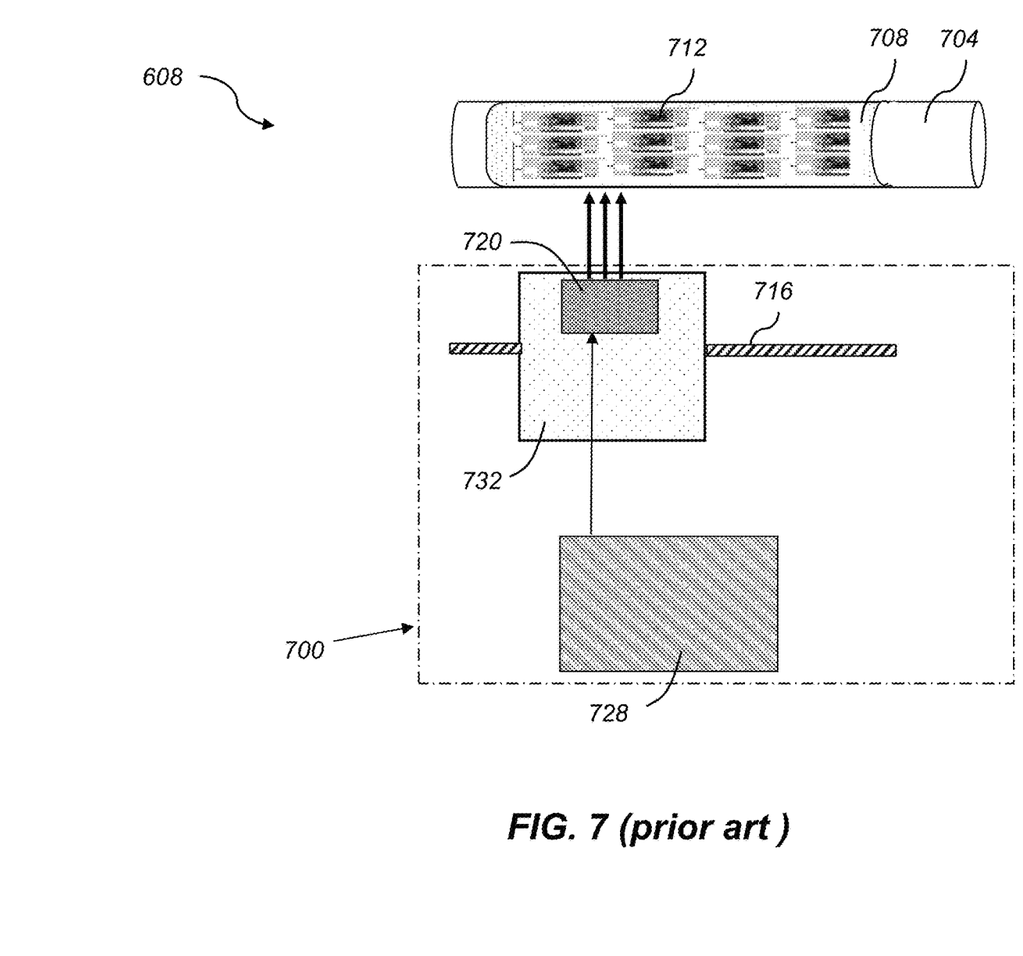
FIG. 7 shows a schematic diagram of an imaging system including a laser imaging head situated on the imaging carriage that writes on a plate mounted on an imaging cylinder.

FIG. 7 shows an exemplary imaging device 608 including imaging system 700. The imaging system 700 includes an imaging carriage 732, on which an imaging head 720 is mounted. The imaging head 720 is controlled by controller 728. The imaging head 720 is configured to image onto a photosensitive substrate 708. The substrate 708 can be a film that can be attached as a mask to a flexographic plate, or alternatively the substrate 708 can be a flexographic plate that is directly imaged by the imaging system 700. The substrate 708 is mounted on a rotating cylinder 704 for exposure. The imaging carriage 732 is adapted to move substantially in parallel to cylinder 704 guided by an advancement screw 716. The substrate 708 is imaged by imaging head 720 to form imaged data 712 on the substrate 708.

Figure 8:
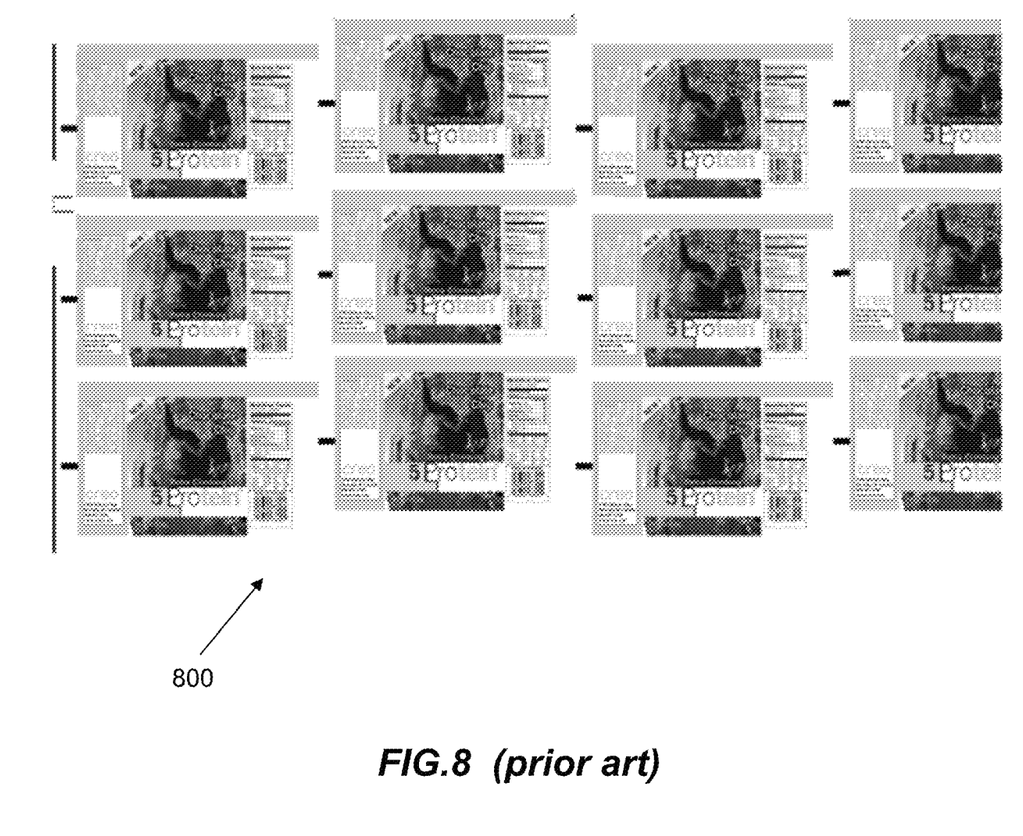
FIG. 8 shows an exemplary rendered image pattern.
Figure 9:
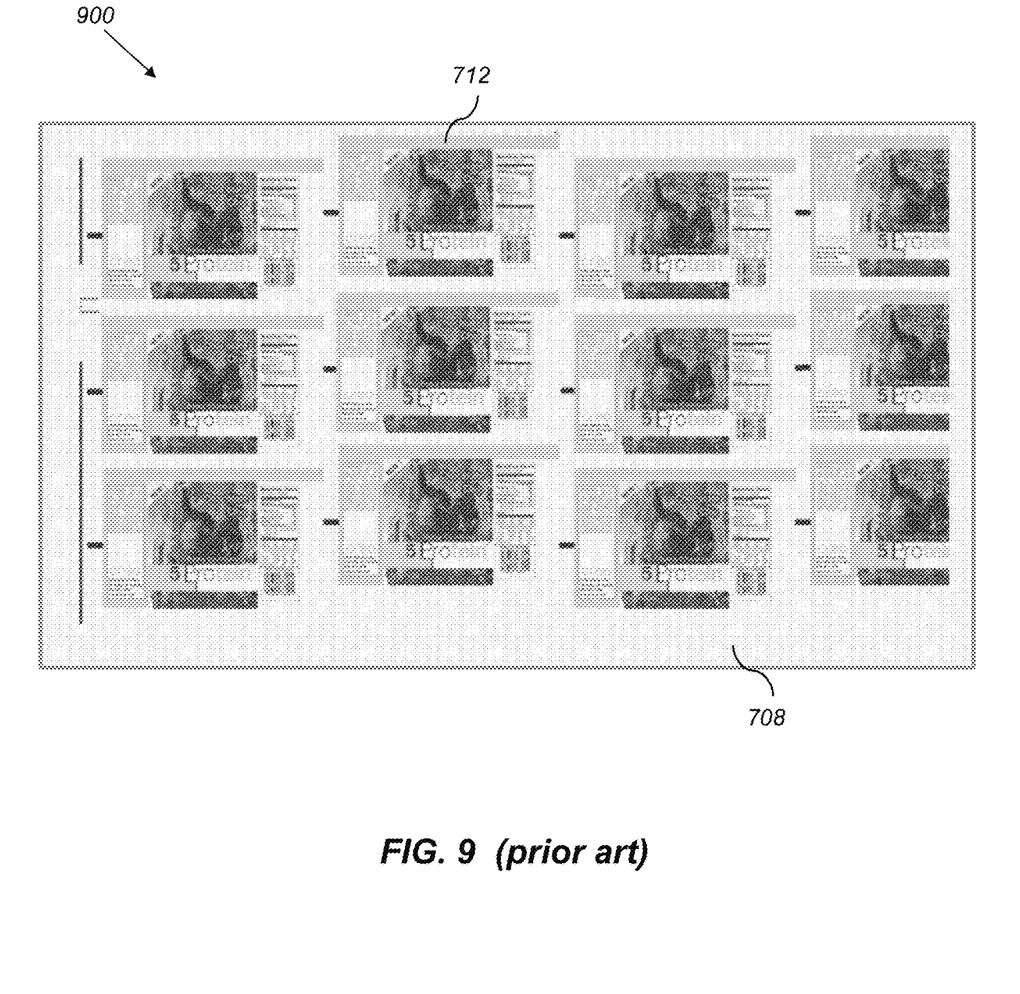
FIG. 9 shows a rendered image pattern on a flexographic plate.

FIG. 8 shows a rendered image pattern 800. The rendered image pattern 800 was prepared by DFE 604, typically using a halftone process, to be imaged onto the substrate 708. FIG. 9 shows an imaged substrate 900 including imaged data 712 corresponding to the rendered image pattern 800 (FIG. 8)

which has been imaged by the imaging head 720 (FIG. 7) onto the substrate 708. The imaged substrate 900 is used to form the flexographic printing plate 20. For example, if the imaged substrate 900 is a film in can be developed to produce a mask that can be used to expose the plate, which is subsequently processed to form the raised features. For cases where the imaged substrate 900 is the plate itself, it can be processed directly to form the raised features.

When printing on certain plastic substrates such as low-density polyethylene (LDPE) using flexographic printing plates 20 voids can sometimes appear on the trailing edge of large solid relief areas. These voids are formed due to entrapment of air bubbles between the plate 20 and the substrate 22. It has been shown that this problem can be mitigated by providing a fine texture pattern 404 along the edges of the relief pattern 402 including slightly deeper valleys in the texture pattern, and providing a coarse texture pattern 408 including larger gaps between the peaks in the interior of the relief pattern 402 (see FIGS. 4-5). This enables ink and air to flow more freely. Such textured patterns are well-suited to printing process inks on various substrates.

It has been found that coarse texture pattern 408 in the interior regions of the relief features 402 of FIG. 5 significantly reduces voids on the trailing edge of solid relief features 402, but the valleys are too deep and wide to allow a uniform deposition of ink. Consequently, the solid density of the printed ink is reduced. The coarse texture pattern 408 in the interior regions of the relief features 402 of FIG. 4 has valleys that are both narrower and shallower than that of FIG. 5. This results in a more uniform distribution of ink, thereby increasing the solid density significantly. However, these shallow valleys do not allow the trapped air and ink to flow freely enough, and consequently voids are only partially eliminated. It has been found that coarse texture patterns 408 cannot be devised that simultaneously optimize for ink density and void suppression.

Figure 10:
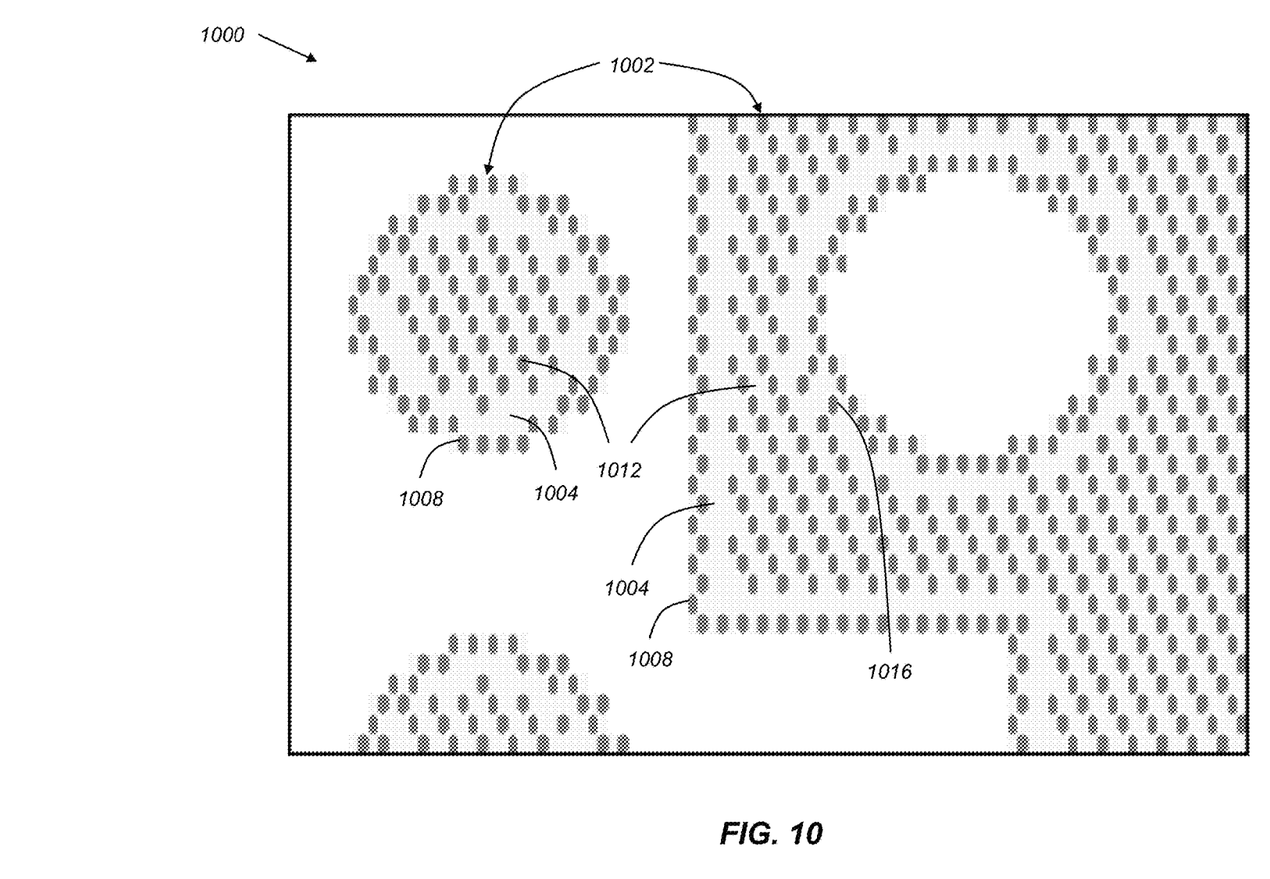
FIG. 10 shows a textured image pattern formed by applying a fine texture pattern to the edge regions of the image features and a coarse texture pattern to the interior regions of the image features with a gap between the two regions.

FIG. 10 shows a textured image pattern 1000 formed using the method of the present invention. The textured image pattern 1000 substantially eliminates trailing edge voids by forming two texture patterns separated by a gap region 1004. The first texture pattern is a fine texture pattern 1008 that is optimized for the edges of the relief features 1002. The second texture pattern is a coarse texture pattern 1012 that is optimized for the interior of the relief features 1002. In some embodiments, the form of the texture patterns can be adapted to a particular application. The gap region 1004 does not need to be contiguous, it can be interrupted occasionally with peaks 1016. The width of the gap region 1004 is selected to be wide enough to improve ink and trapped air flow yet narrow enough to allow ink to bridge the gap. For typical process ink volumes, it has been found that a gap width of approximately 10 microns produces good results. Higher volume inks such as white and spot colors may require greater wider gaps consistent with their volume. In various applications, typical gap widths would be between 5 microns and 30 microns.

Figure 11:
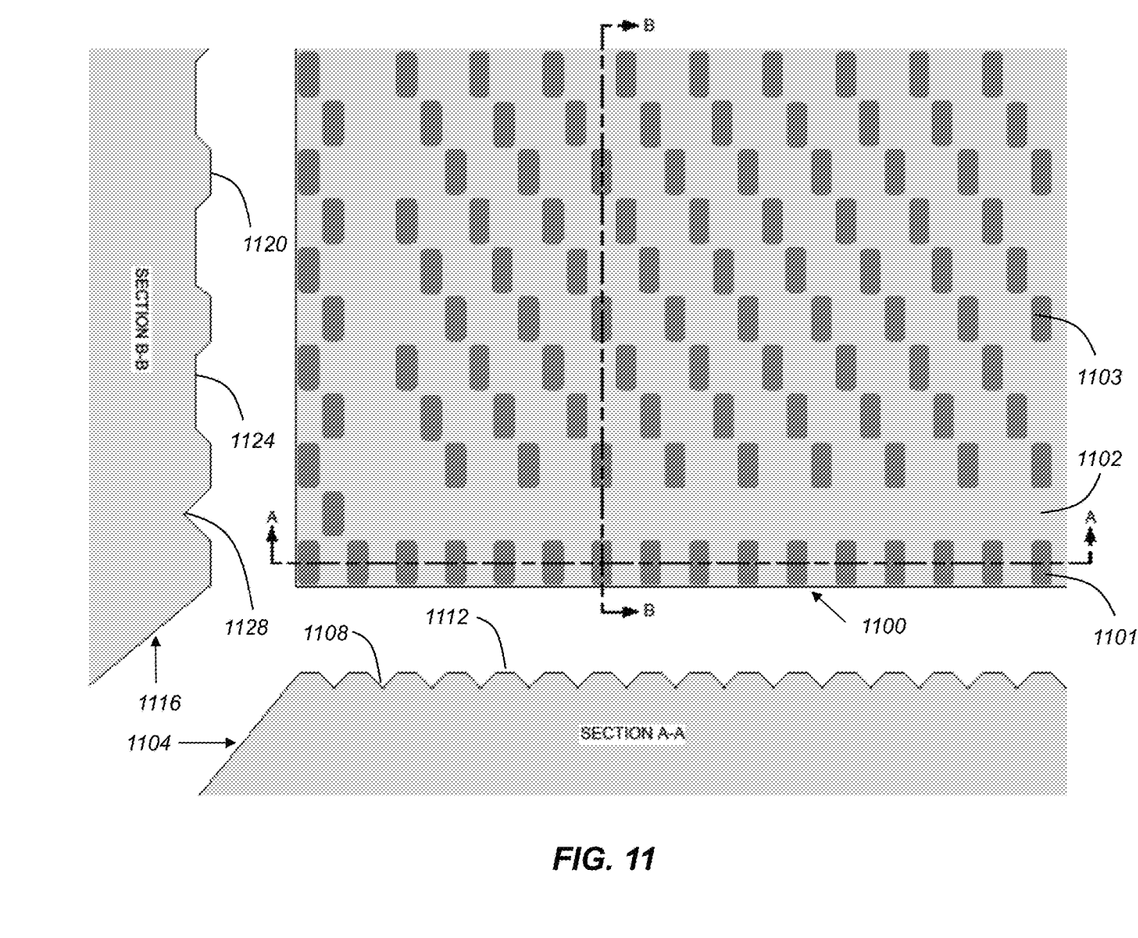
FIG. 11 shows cross sections through a relief feature illustrating characteristics of the edge region, the interior region and the gap region.

FIG. 11 shows cross-sections through a corner of a relief feature 1100 that includes an edge region 1101 with a fine texture pattern, an interior region 1103 with a coarse texture pattern, and a gap region 1102 with no texture pattern. The A-A cross-section 1104 shows the peaks 1108 and valleys 1112 of the texture pattern in the edge region 1101 (e.g., fine texture pattern 1008 of FIG. 10). The B-B cross-section 1116 shows peaks 1120 and valleys 1124 of the texture pattern in the interior region 1103 (e.g., coarse texture pattern 1012 of FIG. 10). In addition, B-B cross-section 1116 shows a deeper valley 1128 corresponding to the gap region 1102. It has been found that this deeper valley 1128 allows better ink and air flow reducing the formation of voids in the trailing edge of the relief features 1100.

Figure 12:
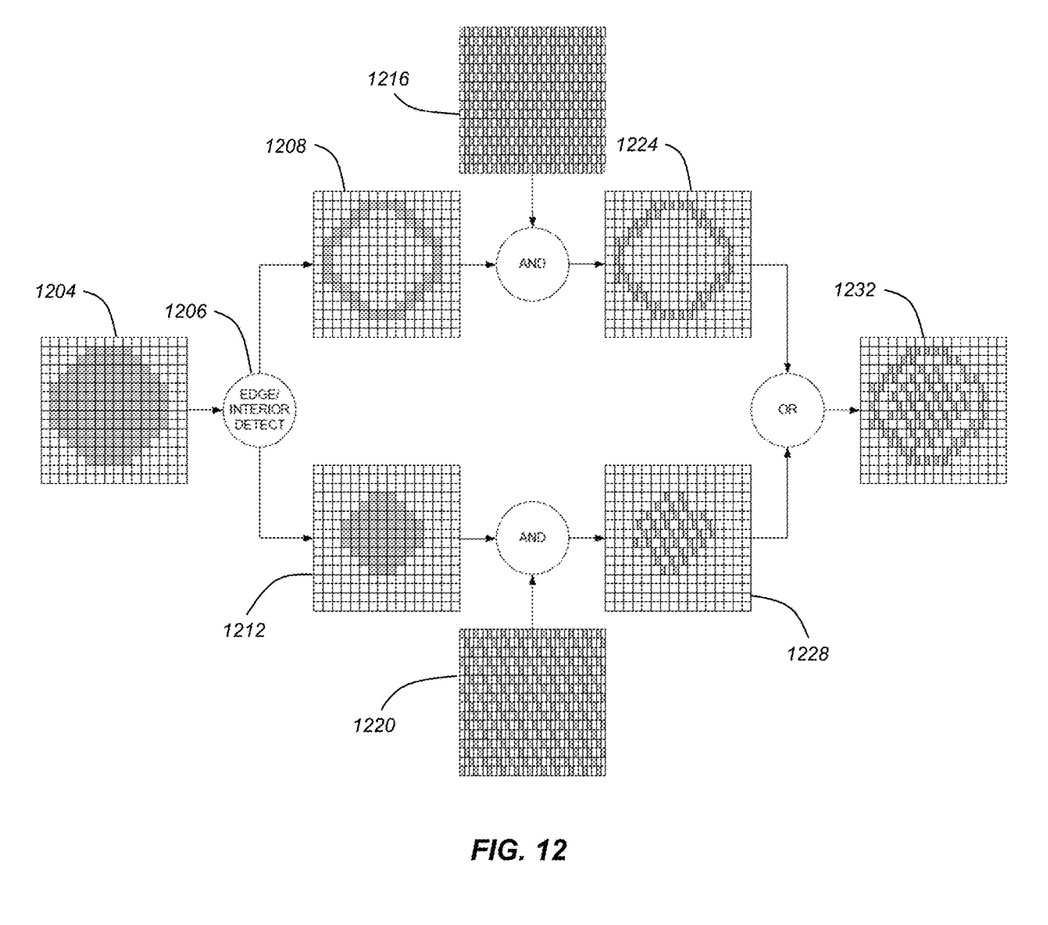
FIG. 12 shows a block diagram illustrating the formation of a textured image pattern in accordance with an exemplary embodiment.

FIG. 12 is a block diagram that shows the steps of an exemplary method for forming textured image patterns in accordance with the present invention. An image pattern 1204 is provided including a set of image features. The image pattern 1204 is generally a binary image defined by an array of binary image pixels. The image features typically include halftone dot patterns, as well as other types of image features such as text characters and lines. In an exemplary embodiment, the image pixels of the image pattern 1204 have two states: "exposed pixels" and "unexposed pixels". The "exposed pixels" are those pixels where the imaging system 700 (FIG. 7) will expose the photosensitive substrate 708 to provide the imaged data 712. Generally, the "exposed pixels" will correspond to those regions of the image pattern 1204 where it is intended to transfer ink from the flexographic printing plate 20 (FIG. 1) onto the substrate 22. The two states can alternately be referred to as "on pixels" and "off pixels" or "printing pixels" and "non-printing pixels." An edge detection process 1206 is applied to the image pattern 1204 to determine an edge pixel mask 1208 specifying edge regions corresponding to edge pixels of the image features, and an interior pixel mask 1212 specifying interior regions corresponding to interior pixels of the image features. The edge regions and the interior regions are separated by gap regions.

A fine texture pattern 1216 is applied to edge regions specified by the edge pixel mask 1208 to create a fine-patterned edge structure 1224. In an exemplary embodiment, the edge pixel mask 1208 and the fine texture pattern 1216 are both binary images. In this case, the fine texture pattern 1216 can be applied by performing a logical "AND" operation to the corresponding pixels. In this case, a pixel in the fine-patterned edge structure 1224 will be "on" if the corresponding pixels in both the fine texture pattern 1216 and the edge pixel mask 1208 are both in the "on" state. Similarly, a coarse texture pattern 1220 is applied to interior regions specified by the interior pixel mask 1212 to create a coarse-patterned interior structure 1228.

In some cases, the image resolution that is used to perform the edge detection process 1206 may be different than the image resolution used to apply the texture patterns. For example, in an exemplary embodiment the image pattern 1204 may be a 2400 dpi pattern having pixels that are approximately 10×10 microns. The edge detection process 1206 can be applied at this resolution to produce an edge pixel mask 1208 and an interior pixel mask 1212 with this same resolution. The fine texture pattern 1216 and the coarse texture pattern 1220 can then be specified at some other resolution. For example, in an exemplary embodiment these texture patterns can be specified with pixels that are 5×10 microns such that two pixels are formed in the fine-patterned edge structure 1224 and the coarse-patterned interior structure 1228 for every pixel in the image pattern 1204. For example, this change in resolution can be accomplished by replicating each of the pixels in the edge pixel mask 1208 and the interior pixel mask 1212 in one direction before performing the AND operations.

Figure 13:
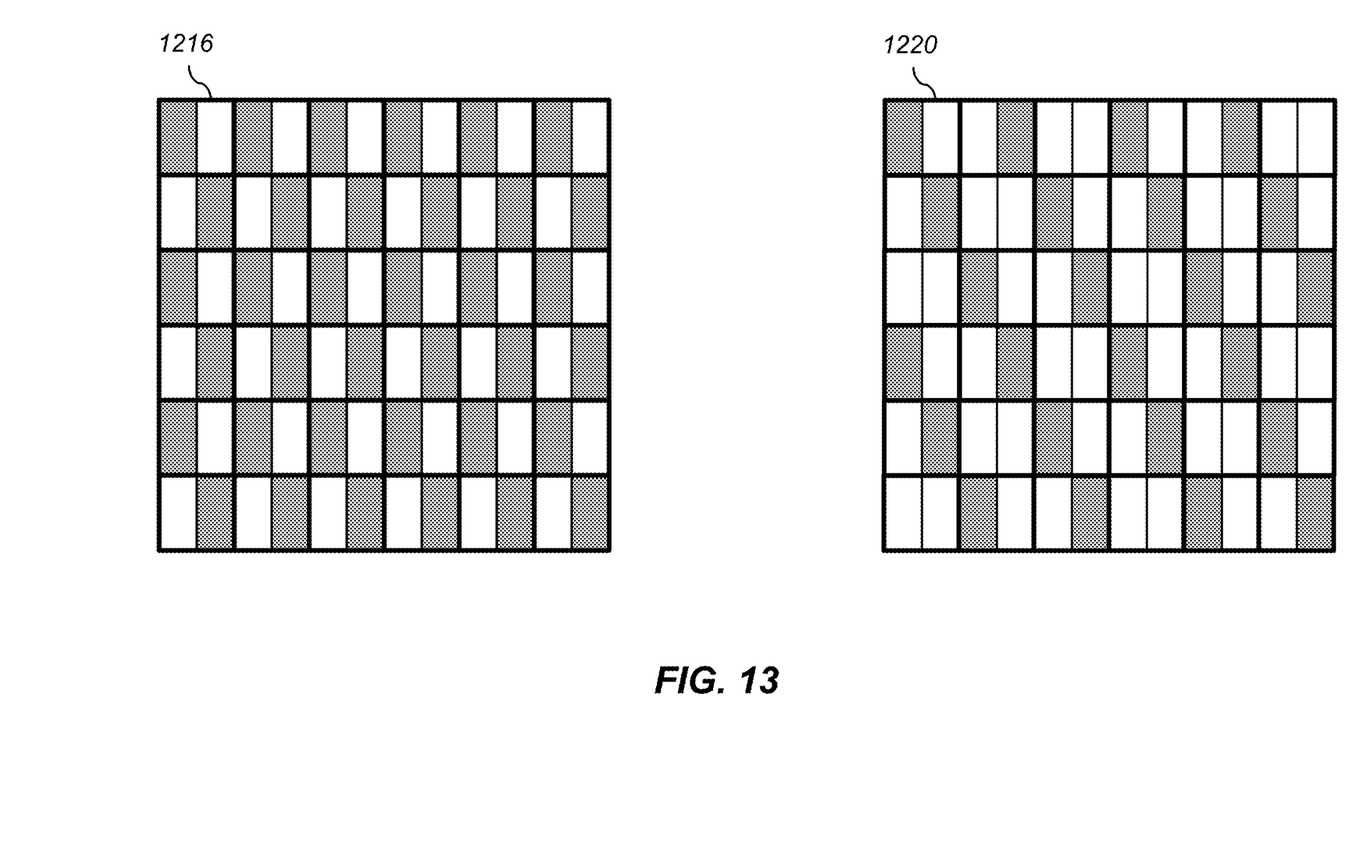
FIG. 13 shows exemplary fine and coarse texture patterns.

FIG. 13 shows a close-up of the fine texture pattern 1216 and the coarse texture pattern 1220 used in an exemplary embodiment. These texture patterns are defined on a pixel grid with 5×10 micron pixels adapted to be written with a 2400×4800 dpi imaging device. The fine texture pattern 1216 includes a checkerboard pattern of "on" pixels. The coarse texture pattern 1220 includes a regular pattern of "on" pixels that are more sparsely distributed than for the fine texture pattern 1216. This coarse texture pattern 1220 can be referred to as a "sparse checkerboard." The fine texture pattern 1216 and the coarse texture pattern 1220 are preferably specified as a pixel array which is tiled across the image in a repeating fashion. The grid shown in bold shows how the texture patterns are overlaid on the pixels of the image pattern 1204 (FIG. 12). It can be seen that each 10×10 micron in the image pattern 1204 corresponds to two 5×10 micron pixels in the texture patterns.

The terms "fine" and "coarse" as used here are relative terms which reflect that the coarse texture pattern 1220 has a coarser texture than the fine texture pattern 1216. A texture can be said to be "coarser" if it has a lower dominant frequency, or if the average spacing between the "on" pixels (or groups of "on" pixels) is larger. For example, in the patterns of FIG. 13, the fine texture pattern 1216 has a dominant frequency that is half the writing frequency, and the coarse texture pattern 1220 has a dominant frequency that is one third of the writing frequency.

The final step is to combine the fine-patterned edge structure 1224 and the coarse-patterned interior structure 1228 into a textured image pattern 1232. This can be accomplished by performing a logical "OR" operation to the corresponding pixels. In this case, a pixel in the textured image pattern 1232 will be "on" if a corresponding pixel in either the fine-patterned edge structure 1224 or the coarse-patterned interior structure 1228 is in the "on" state. The textured image pattern 1232 is used to form the flexographic plate 20 (FIG. 1) by using an imaging system 700 (FIG. 7) to write the textured image pattern 1232 onto a photosensitive substrate. (As discussed earlier, the photosensitive substrate 708 can be an undeveloped flexographic plate, or can be a film that is used to form the flexographic plate.) The "on" pixels in the textured image pattern 1232 correspond to the pixel locations where the imaging system exposes the photosensitive substrate.

Figure 14:
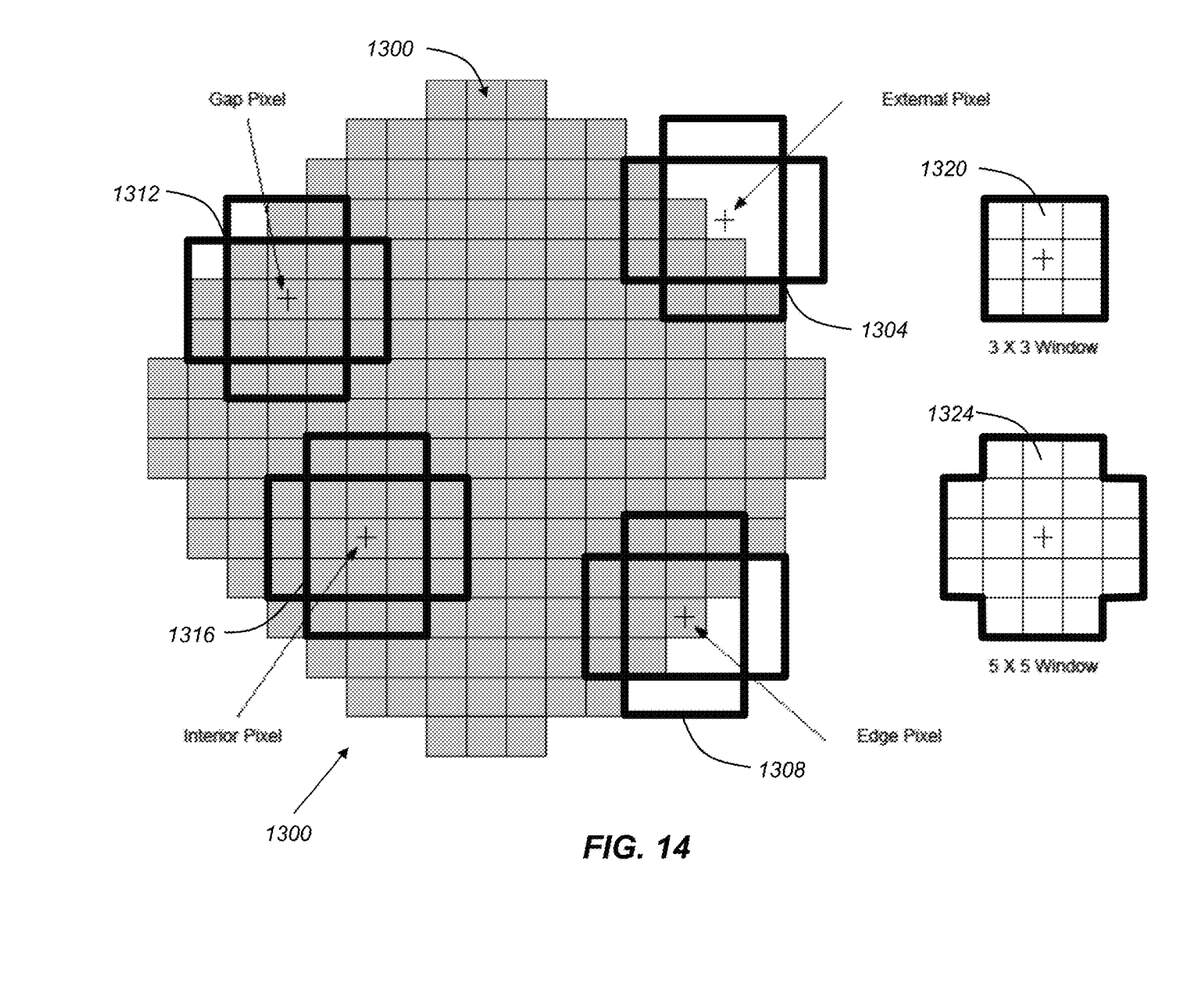
FIG. 14 illustrates the use of two pixel windows to classify pixels as belonging to an edge region, an interior region or a gap region.

The edge detection process 1206 selects pixels in the image pattern 1204 to be part of the edge region or interior region based on their proximity to an edge of a relief feature. In an exemplary embodiment, the edge detection process 1206 uses a 3×3 pixel window 1320 and a 5×5 pixel window 1324 (with the corners removed) as illustrated in FIG. 14. These pixel windows produce a gap region with a gap width of about 10 microns for image resolutions of 2400 pixels/inch, which has been found to produce good results for typical process ink volumes. Other pixel window shapes can also be used in accordance with other embodiments of the invention, where the size and shape of the pixels windows 1320, 1324 will control the width and characteristics of the edge regions and the gap regions. In general, the pixel window 1324 should be larger than the pixel window 1320. In alternate embodiments, any other appropriate image analysis method known in the art can be used to identify the edge regions, interior regions and gap regions.

The pixel windows 1320, 1324 are overlaid on the pixels of the image pattern 1204 (FIG. 12) to classify edge pixels and interior pixels. In the case where all of the pixels in the 5×5 pixel window 1324 are exposed pixels 1300 then the center pixel is deemed to be an interior pixel belonging to an interior region (e.g., see mask position 1316). If the center pixel is an exposed pixel and at least one of the other pixels in the 3×3 pixel window 1320 is not an exposed pixel, then the center pixel is deemed to be an edge pixel belonging to an edge region (e.g., see mask position 1308). If all the pixels in the 3×3 pixel window 1320 are exposed pixels and at least one of the pixels in the 5×5 pixel window 1324 is not an exposed pixel, then the center pixel is deemed to be a gap pixel belonging to a gap region (e.g., see mask position 1312). All other pixels in the image are deemed exterior pixels (e.g., see mask position 1304). The result of this operation is to designate an interior pixel mask 1212 (FIG. 12) corresponding to all the identified interior pixels and an edge pixel mask 1208 (FIG. 12) corresponding to all the identified edge pixels.

In an exemplary embodiment, the textured image pattern 1232 is formed by replacing exposed pixels in the rendered image pattern 1204 (FIG. 12) with corresponding pixels from the fine texture pattern 1216 and the coarse texture pattern 1220. If an exposed pixel in the rendered image pattern 1204 belongs to the edge pixel mask 1208 then that pixel is replaced by the corresponding pixel in the fine pattern image 1216. Similarly, if an exposed pixel in the rendered image pattern 1204 belongs to the interior pixel mask 1212, then that pixel is replaced by the corresponding pixel in the coarse texture pattern 1220.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents. The principles of the present invention may similarly be applied to other types of patterns or printing methods.

The invention has been described in detail with particular reference to certain preferred embodiments thereof, but it will be understood that variations and modifications can be effected within the scope of the invention.

PARTS LIST 10 ink
12 fountain roller
14 anilox roller
16 doctor blade
18 printing plate cylinder
20 plate
22 substrate
24 impression cylinder
26 fountain pan
30 flexographic printing press
204 raised feature
208 raised feature
212 raised feature
216 relief depth
220 floor
302 no surface texture pattern
303 conventional plate cell pattern
304 checkerboard surface texture
400 textured image pattern
402 relief feature
404 fine texture pattern
408 coarse texture pattern
600 plate forming system
604 digital front end (DFE)
608 imaging device
612 interface line
700 imaging system
704 cylinder 708 substrate
712 imaged data
716 advancement screw
720 imaging head
728 controller
732 imaging carriage
800 rendered image pattern
900 imaged substrate
1000 textured image pattern
1002 relief feature
1004 gap region
1008 fine texture pattern
1012 coarse texture pattern
1016 peak
1100 relief feature
1101 edge region
1102 gap region
1103 interior region
1104 A-A cross-section
1108 peak
1112 valley
1116 B-B cross-section
1120 peak
1124 valley
1128 valley
1204 mage pattern
1206 edge detection process
1208 edge pixel mask
1212 interior pixel mask
1216 fine texture pattern
1220 coarse texture pattern
1224 fine-patterned edge structure
1228 coarse-patterned interior structure
1232 textured image pattern
1300 exposed pixel
1304 mask position
1308 mask position
1312 mask position
1316 mask position
1320 pixel window
1324 pixel window

The invention claimed is:

1. A method for forming a flexographic plate comprising:
providing an image pattern including image features to be formed on the flexographic plate, the image pattern including an array of image pixels, wherein the image pixels include printing pixels corresponding to portions of the image pattern where ink is to be printed on a substrate by the flexographic plate;
identifying edge regions of the image features;
identifying interior regions of the image features;
wherein the edge regions and the interior regions are separated by gap regions;
providing a fine texture pattern;
providing a coarse texture pattern;
applying the fine texture pattern to the edge regions of the image features and applying the coarse texture pattern to the interior regions of the image features to form a textured image pattern, wherein no texture pattern is applied to the gap regions thereby leaving gaps between the edge regions and the interior regions of the image features; and
forming a flexographic plate using the textured image pattern.

2. The method of claim 1, wherein the edge regions include image pixels along edges of the image features.

3. The method of claim 1, wherein the gap regions include image pixels adjacent to the edge regions.

4. The method of claim 1, wherein first and second pixel windows are used to determine whether an image pixel belongs to an edge region, an interior region or a gap region.

5. The method of claim 4, wherein the second pixel window is larger than first pixel window.

6. The method of claim 5, wherein a particular image pixel is identified as belonging to an edge region if the particular image pixel is a printing pixel and at least one of the image pixels in the first pixel window is not a printing pixel when the first pixel window is centered on the particular image pixel.

7. The method of claim 5, wherein a particular image pixel is identified as belonging to an interior region if the all image pixels in the second pixel window are printing pixels when the second pixel window is centered on the particular image pixel.

8. The method of claim 5, wherein a particular image pixel is identified as belonging to a gap region if the all of the image pixels in the first pixel window are printing pixels and at least one the image pixels in the second pixel window is not a printing pixel when the first and second pixel windows are centered on the particular image pixel.

9. The method of claim 5, wherein the first pixel window is a 3×3 pixel window and the second pixel window is a 5×5 pixel window.

10. The method of claim 9, wherein corner pixels of the 5×5 pixel window are removed.

11. The method of claim 1, wherein a width of the gap region is in the range of 5-30 microns.

12. The method of claim 1, wherein the image pattern is a binary image pattern.

13. The method of claim 12, wherein the image features include halftone dots, text characters or lines.

14. The method of claim 1, wherein the fine texture pattern is a checkerboard pattern and the coarse texture pattern is a sparse checkerboard pattern.

15. The method of claim 1, wherein the coarse texture pattern has a lower dominant frequency that the fine texture pattern.

* * * * *